(12) United States Patent
Ramaswamy et al.

(10) Patent No.: US 11,935,724 B2
(45) Date of Patent: *Mar. 19, 2024

(54) SYMMETRIC VHF SOURCE FOR A PLASMA REACTOR

(71) Applicant: Applied Materials, Inc., Santa Clara, CA (US)

(72) Inventors: Kartik Ramaswamy, San Jose, CA (US); Igor Markovsky, San Jose, CA (US); Zhigang Chen, Campbell, CA (US); James D. Carducci, Sunnyvale, CA (US); Kenneth S. Collins, San Jose, CA (US); Shahid Rauf, Pleasanton, CA (US); Nipun Misra, Emeryville, CA (US); Leonid Dorf, San Jose, CA (US); Zheng John Ye, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/168,421

(22) Filed: Feb. 13, 2023

(65) Prior Publication Data

US 2023/0197406 A1 Jun. 22, 2023

Related U.S. Application Data

(60) Continuation of application No. 17/353,668, filed on Jun. 21, 2021, now Pat. No. 11,587,766, which is a continuation of application No. 15/793,802, filed on Oct. 25, 2017, now Pat. No. 11,043,361, which is a continuation of application No. 14/548,692, filed on (Continued)

(51) Int. Cl.
*H01L 21/00* (2006.01)
*C23C 16/00* (2006.01)
*H01J 37/32* (2006.01)

(52) U.S. Cl.
CPC .. *H01J 37/32091* (2013.01); *H01J 37/32018* (2013.01); *H01J 37/32082* (2013.01); *H01J 37/32183* (2013.01); *H01J 37/32541* (2013.01); *H01J 37/32568* (2013.01); *H01J 37/32577* (2013.01); *H01J 37/32587* (2013.01); *H01J 37/32596* (2013.01); *H01J 37/3266* (2013.01); *H01J 37/32715* (2013.01); *H01J 37/32834* (2013.01)

(58) Field of Classification Search
None
See application file for complete search history.

(56) References Cited

U.S. PATENT DOCUMENTS

| 6,199,505 B1 * | 3/2001 | Sato | H01J 37/32183 |
| | | | 315/111.21 |
| 6,445,134 B1 | 9/2002 | Asmus | |

(Continued)

FOREIGN PATENT DOCUMENTS

| JP | 11297496 A | * 10/1999 | ........ H01J 37/32082 |
| JP | 2002319576 A | * 10/2002 | ........ H01J 37/32082 |

*Primary Examiner* — Sylvia MacArthur
*Assistant Examiner* — Michelle Crowell
(74) *Attorney, Agent, or Firm* — Fish & Richardson P.C.

(57) ABSTRACT

The disclosure pertains to a capacitively coupled plasma source in which VHF power is applied through an impedance-matching coaxial resonator having a symmetrical power distribution.

15 Claims, 7 Drawing Sheets

Related U.S. Application Data

Nov. 20, 2014, now Pat. No. 9,824,862, which is a division of application No. 13/047,052, filed on Mar. 14, 2011, now Pat. No. 8,920,597.

(60) Provisional application No. 61/375,370, filed on Aug. 20, 2010.

(56) References Cited

U.S. PATENT DOCUMENTS

| | | | |
|---|---|---|---|
| 6,528,751 B1 | 3/2003 | Hoffman et al. | |
| 6,641,786 B2 | 11/2003 | Hall et al. | |
| 6,667,577 B2* | 12/2003 | Shannon | H01J 37/321 315/111.21 |
| 7,025,857 B2 | 4/2006 | Higashiura | |
| 7,132,040 B2 | 11/2006 | Yamagishi et al. | |
| 7,141,757 B2* | 11/2006 | Hoffman | H01J 37/32183 156/345.47 |
| 7,196,283 B2 | 3/2007 | Buchberger et al. | |
| 7,220,937 B2 | 5/2007 | Hofman et al. | |
| 7,777,599 B2 | 8/2010 | Shannon et al. | |
| 8,920,597 B2 | 12/2014 | Ramaswamy et al. | |
| 9,824,862 B2* | 11/2017 | Ramaswamy | H01J 37/32596 |
| 11,043,361 B2* | 6/2021 | Ramaswamy | H01J 37/32183 |
| 11,587,766 B2* | 2/2023 | Ramaswamy | H01J 37/32018 |
| 2002/0108933 A1* | 8/2002 | Hoffman | H01J 37/32183 219/121.4 |
| 2003/0056901 A1* | 3/2003 | Nakano | H01J 37/32082 156/345.47 |
| 2003/0057844 A1* | 3/2003 | Windhorn | H01J 37/32174 315/111.01 |
| 2003/0178143 A1 | 9/2003 | Perrin | |
| 2004/0027781 A1 | 2/2004 | Hanawa et al. | |
| 2005/0178748 A1* | 8/2005 | Buchberger | H01J 37/32183 219/121.48 |
| 2006/0021580 A1 | 2/2006 | Hirano | |
| 2009/0025878 A1 | 1/2009 | Rauf et al. | |
| 2009/0025879 A1* | 1/2009 | Rauf | H01J 37/16 156/345.48 |
| 2009/0140828 A1* | 6/2009 | Shannon | H01J 37/32091 333/235 |
| 2010/0206483 A1* | 8/2010 | Sorensen | H01J 37/32091 156/345.43 |
| 2011/0023780 A1* | 2/2011 | Ramaswamy | H01P 7/04 333/32 |
| 2013/0292057 A1 | 11/2013 | Ramaswamy et al. | |
| 2015/0075716 A1 | 3/2015 | Ramaswamy | |
| 2015/0075717 A1 | 3/2015 | Ramaswamy | |
| 2016/0276134 A1 | 9/2016 | Collins | |

\* cited by examiner

SYMMETRIC VHF SOURCE FOR A PLASMA REACTOR

CROSS-REFERENCE TO RELATED APPLICATIONS

This application is a continuation of U.S. patent application Ser. No. 17/353,668, filed Jun. 21, 2021, which is a continuation of U.S. patent application Ser. No. 15/793,802, filed Oct. 25, 2017, which is a continuation of U.S. patent application Ser. No. 14/548,692, filed Nov. 20, 2014, which is a divisional of U.S. patent application Ser. No. 13/047,052, filed Mar. 14, 2011, which claims benefit of U.S. Provisional Application Ser. No. 61/375,370, filed Aug. 20, 2010, the disclosures of each of which are incorporated by reference.

TECHNICAL FIELD

The disclosure pertains to a capactively coupled plasma source in which VHF power is applied through an impedance-matching coaxial resonator to an overhead electrode, and in which the coaxial resonator is folded to reduce its length, and VHF power is applied from a symmetrical feeder inside the folded coaxial resonator to enhance uniformity of plasma distribution.

BACKGROUND

A capacitively coupled plasma source for processing a workpiece, such as a semiconductive wafer, has a fixed impedance match element in the form of a coaxial resonator or tuning stub through which VHF power is applied to a discoid or cylindrically symmetrical overhead electrode. A VHF power generator is connected to the tuning stub at a point along its axis at which the RF impedance matches the impedance of the VHF power generator. One limitation of such a structure is that the coaxial tuning stub is exceptionally long, being on the order of a half wavelength of the VHF generator, which may be 0.93 meters for a VHF frequency of 162 MHz. Another limitation is that the plasma distribution produced by such a source tends to be skewed, or non-uniform in an azimuthal direction. As employed herein, the terms azimuthal and radial are employed to signify directions in a cylindrical structure that are mutually orthogonal: The term radial signifies a direction along a radial line whose origin is the cylindrical axis of symmetry. The term azimuthal signifies a direction of travel along a circumference of the cylindrical structure. Non-uniform plasma distribution in the azimuthal direction may be referred to as skew. Plasma distribution may be skewed because of asymmetrical features of the plasma reactor, such as a bend in the coaxial tuning stub, RF-feeding of the tuning stub from one side, the presence of a slit opening in one side of the chamber wall, and the presence of a pumping port in the floor of the chamber of the plasma reactor.

SUMMARY

A plasma reactor includes a vacuum chamber enclosure comprising a ceiling and a cylindrical side wall, the ceiling comprising a center electrode, a dielectric support ring around the center electrode and a workpiece support having a support surface facing the ceiling. The reactor further comprises a coaxial resonator comprising: (a) a hollow outer conductive cylinder coaxial with the cylindrical side wall and having a bottom edge on the dielectric support ring, (b) a hollow center conductive cylinder coaxial with the outer conductive cylinder and having a bottom edge contacting the center electrode, and (c) an annular conductor contacting a top edge of the hollow outer conductive cylinder and contacting a top edge of the hollow center conductive cylinder. The reactor further includes a VHF power generator and a power coupler comprising: (a) an axial center conductor connected at a first end to the VHF generator and extending through an interior of the hollow center conductive cylinder to a second end thereof at a selected axial location; and (b) plural respective spoke conductors extending radially from the second end of the axial center conductor and terminating at and contacting the center conductive cylinder in a circular plane at the selected axial location, the plural respective spoke conductors being symmetrically distributed.

In one embodiment, the selected axial location corresponds to an impedance presented to the power coupler matching an output impedance of the VHF generator.

In one embodiment, the power coupler further comprises an axial grounded outer conductor coaxial with and surrounding the axial conductor of the power coupler, and plural respective grounded spoke outer conductors coaxial with and around respective ones of the plural spoke conductors, the axial grounded outer conductor and the plural grounded spoke outer conductors being joined together near the second end of the axial center conductor.

In a related embodiment, the power coupler further comprises an axial grounded outer conductor coaxial with and surrounding the axial conductor of the power coupler, and a grounded conductive plane extending parallel to and facing the plural spoke conductors.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1A:
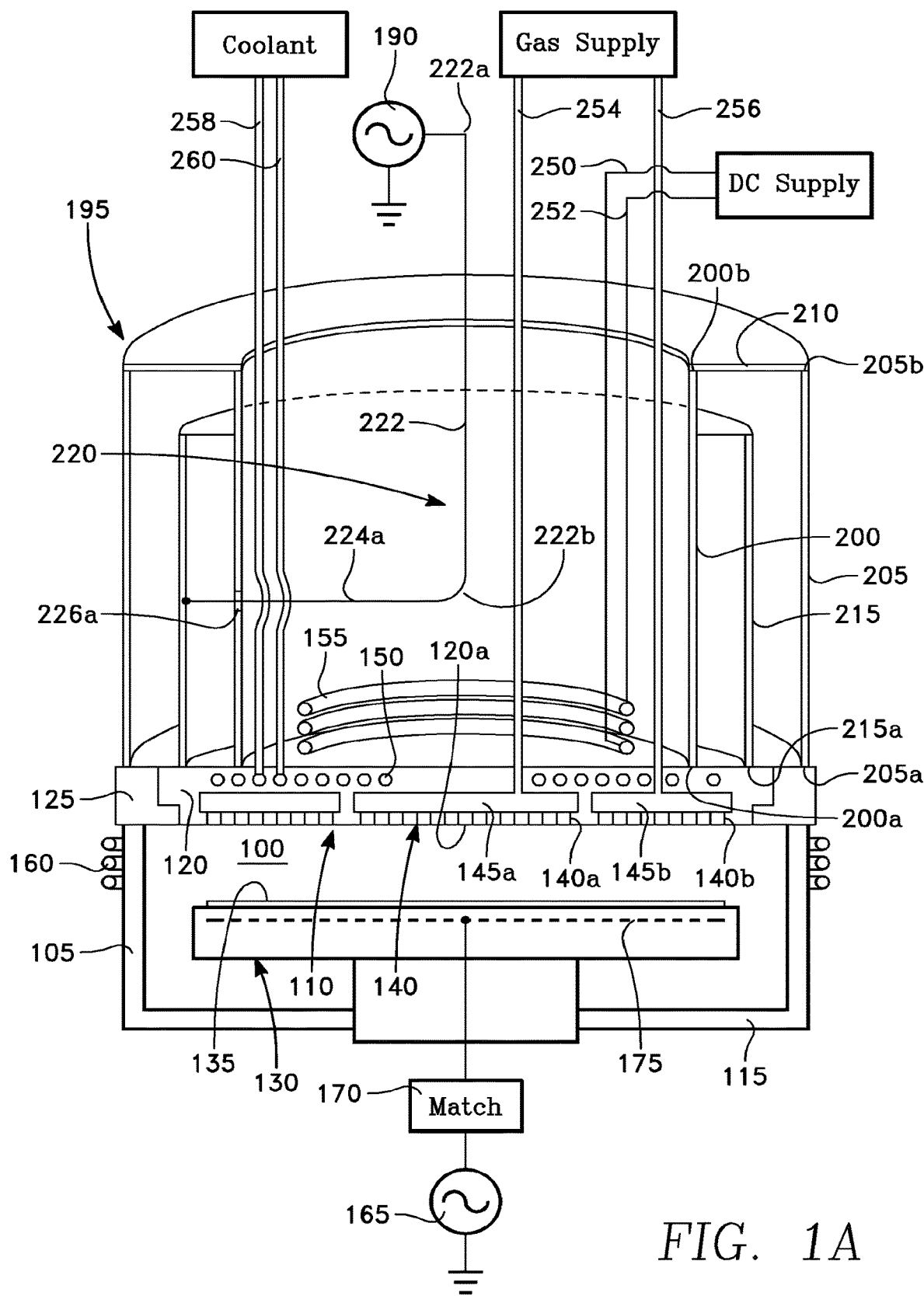
FIGS. 1A and 1B depict a plasma reactor in accordance with a first embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

FIG. 1A depicts a plasma reactor having a capacitively coupled plasma source. The reactor has a chamber 100 enclosed by a cylindrical side wall 105, a ceiling 110 and a floor 115. The ceiling 110 includes a disc shaped ceiling electrode 120 surrounded by a dielectric ring 125. A workpiece support pedestal 130 supports a workpiece such as a semiconductor wafer 135 to be processed. VHF plasma source power is applied to the ceiling electrode 120 in a manner described below. The ceiling electrode 120 serves as a gas distribution showerhead, having gas injection orifices 140 in its bottom surface 120a facing the interior of the chamber 100. The orifices 140 may be grouped into radially inner and outer gas injection zones 140a, 140b that are supplied by gas from internal inner and outer gas manifolds 145a, 145b within the ceiling electrode 120. Internal coolant passages 150 within the ceiling electrode 120 facilitate heat exchange with the ceiling electrode 120. The reactor further includes inner and outer plasma steering magnets or coil windings 155, 160. An RF bias power generator 165 is coupled through an RF impedance match element 170 to an internal electrode 175 within the workpiece support pedestal 130.

Plasma source power is applied to the ceiling electrode 120 from a VHF power generator 190 through a fixed impedance matching element. In certain embodiments described herein, the fixed impedance match element embodies a folded coaxial resonator 195, whose length is about half that of the basic coaxial tuning stub mentioned previously herein. This provides an advantageous reduction in size and increased access and serviceability. Specifically, the physical length of the folded coaxial resonator 195 is about a quarter wavelength at the frequency of the VHF generator 190.

The folded coaxial resonator 195 includes an inner conductive hollow cylinder 200 that is coaxial with the ceiling electrode 120. The inner conductive hollow cylinder 200 has a circular bottom edge 200a electrically contacting the top surface of the ceiling electrode 120. The folded coaxial resonator 195 further includes an outer hollow conductive cylinder 205 having a circular bottom edge 205a contacting the top surface of the dielectric ring 125. The inner and outer hollow conductive cylinders 200, 205 are of at least approximately the same axial length, so that their circular top edges 200b, 205b are at the same height above the ceiling electrode 120. The folded coaxial resonator 195 also includes a planar conductive annulus 210 resting upon and electrically connecting the circular top edges 200b, 205b of the inner and outer hollow conductive cylinders 200, 205. The folded coaxial resonator 195 further includes a center hollow conductive cylinder 215 coaxial with the inner and outer hollow conductive cylinders 200, 205 and located between them. Preferably, the radius of the center hollow conductive cylinder 215 may be the geometric mean of the radii of the inner and outer hollow conductive cylinders 200, 205. The center hollow conductive cylinder 215 has a circular bottom edge 215a resting on and in electrical contact with the top surface of the ceiling electrode 120.

A VHF power coupler 220 conducts VHF power from the VHF generator 190 to the center hollow conductive cylinder 215. Thus, the center hollow conductive cylinder 215 is the RF hot center conductor of the folded coaxial resonator 195, while the inner and outer hollow conductive cylinders 200, 205 together with the planar conductive annulus 210 are analogous to a grounded outer conductor of a simple coaxial resonator. The electrical connection of the circular bottom edges 200a, 215a to the ceiling electrode 120 provides the requisite D.C. short, equivalent to the D.C. short at the end of a simple (unfolded) coaxial tuning stub.

Figure 1B:
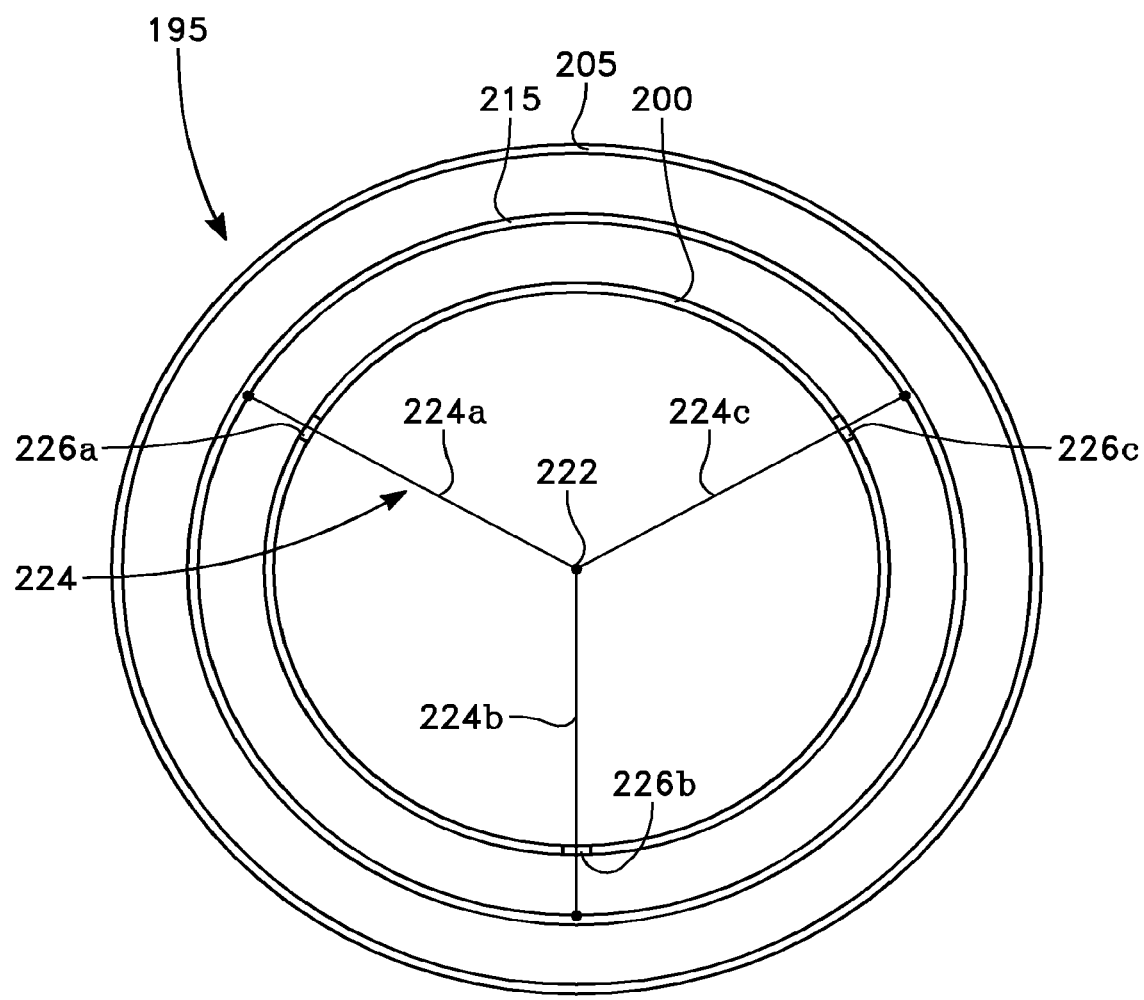

As shown in FIG. 1A, the VHF power coupler 220 includes an axial conductor 222 extending through a top portion of the hollow inner cylinder 200 from a top end 222a outside of the inner cylinder 200 to an axial conductor bottom end 222b inside of the inner cylinder 200. A first spoke conductor 224a extends radially from the axial conductor bottom end 222b through a hole 226a in the inner cylinder 200 to the center conductive cylinder 215. As depicted in FIG. 1B, there are a plurality of spoke conductors 224a, 224b, 224c, symmetrically arranged and extending radially from the axial conductor bottom end 222b, through respective holes 226a, 226b, 226c in the inner cylinder 200 and to the center conductive cylinder 215 to which their outer ends are electrically connected. In the embodiment depicted in FIGS. 1A and 1B, there are three spoke conductors 224 disposed at 120 degree intervals, although any suitable number n of spoke conductors 224 may be provided at 360/n degree intervals.

Conduits and conductors for various utilities extend through the hollow inner cylinder 200. These include electric conductors 250, 252 carrying D.C. current to the plasma steering magnet 155, gas lines 254, 256 carrying process gas to the inner and outer gas manifolds 145a, 145b, and coolant conduits 258, 260 carrying coolant to and from the internal coolant passages 150. The interior of the inner cylinder 200 is devoid of electric fields, so that arcing or electrical breakdown of these utility lines is avoided or minimized.

Figure 2A:
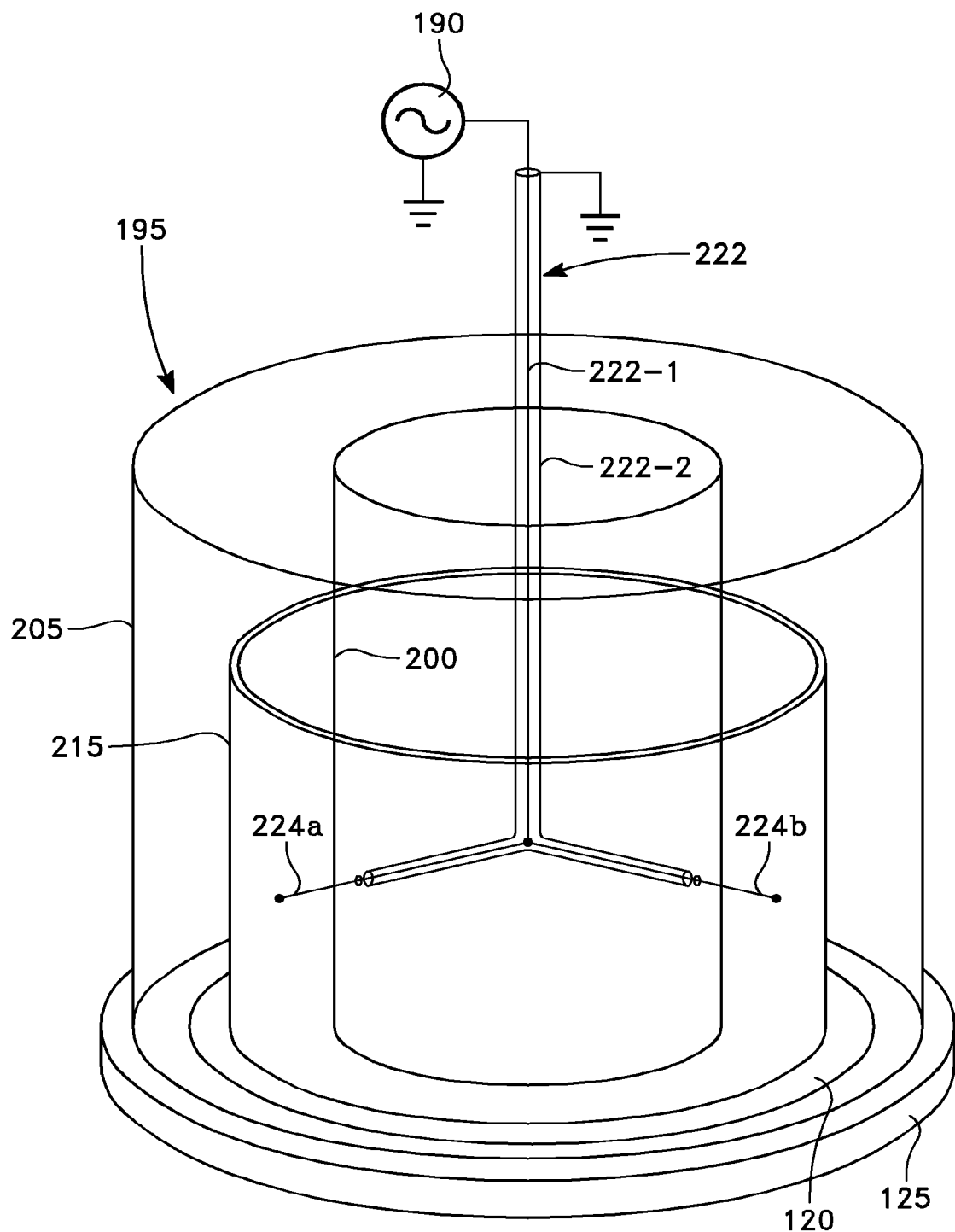
FIGS. 2A and 2B depict a VHF power coupler in accordance with another embodiment.
Figure 2B:
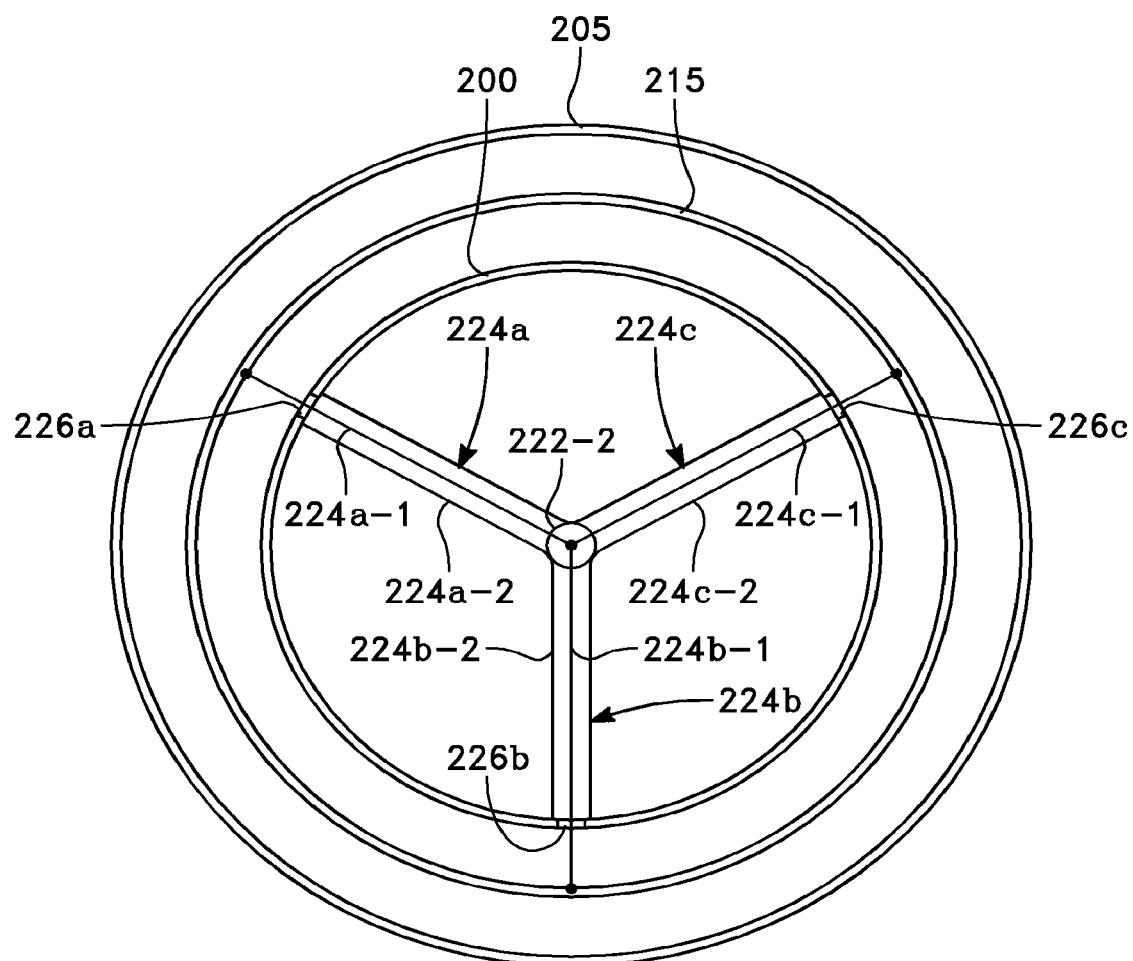
Figures 2C, 3:
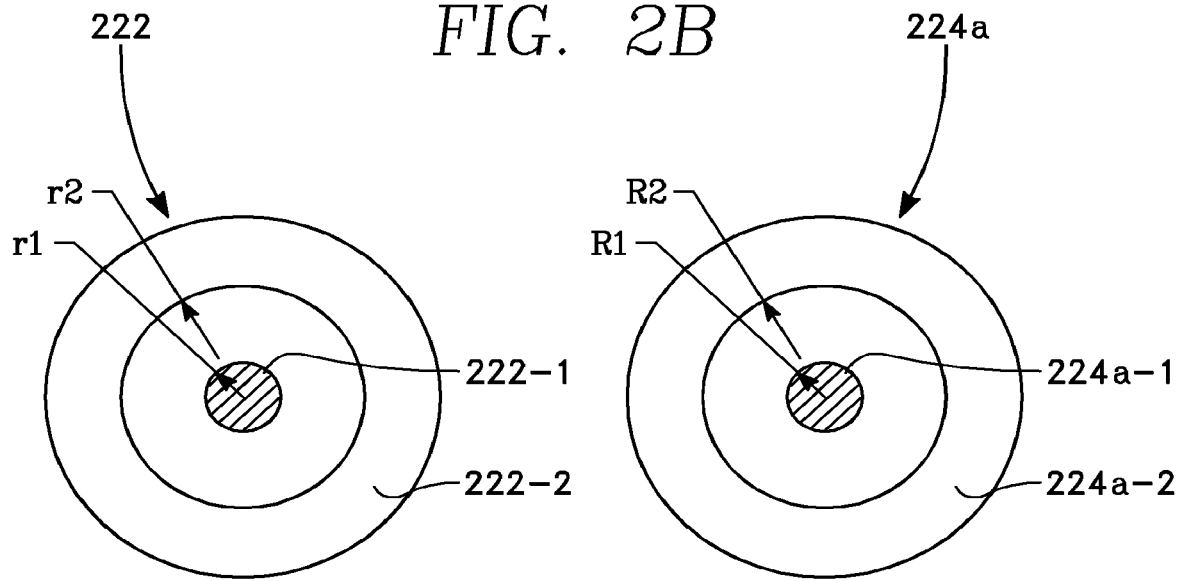
FIGS. 2C and 3 are cross-sectional views of the axial and spoke conductors, respectively, in the VHF power coupler of FIGS. 2A and 2B.

In preferred embodiments, the VHF power coupler 220 is provided as a coaxial structure in which the axial conductor 222 and each of the spoke conductors 224 is a coaxial transmission line including a center conductor that is RF hot, surrounded by a grounded outer conductor or shield. This coaxial structure is depicted in FIGS. 2A and 2B, and is compatible with the field-free environment of the interior of the inner hollow conductive cylinder 200. In the embodiment of FIGS. 2A and 2B, the axial conductor 222 consists of a center axial conductor 222-1 connected to the output of the VHF generator 190, and a grounded outer axial conductor 222-2 surrounding the center axial conductor. FIG. 2C depicts a cross-sectional view of the axial conductor 222.

Each of the spoke conductors 224a, 224b, 224c embodies a coaxial transmission line structure. Thus, the spoke conductor 224a consists of a center spoke conductor 224a-1 and an outer spoke conductor 224a-2 surrounding the center spoke conductor 224a-1. The center spoke conductor 224a-1 extends radially from the axial center conductor 222-1 and terminates at and is electrically connected to the center conductive cylinder 215. The center spoke conductor 224a-1 is RF hot by reason of its connection to the axial center conductor 222-1. The outer spoke conductor 224a-2 extends from the grounded axial outer conductor 222-2 and is terminated at (and electrically connected to) the inner cylinder 200. The center spoke conductor 224a-1 passes through the hole 226a (without contacting the inner conductive cylinder 200) to contact the center conductive cylinder 215.

The structure of each of the spoke conductors 224a, 224b, 224c is the same. Thus, the spoke conductor 224b consists of a center spoke conductor 224b-1 and an outer spoke conductor 224b-2 surrounding the center spoke conductor 224b-1. The center spoke conductor 224b-1 extends radially from the axial center conductor 222-1 and terminates at the center conductive cylinder 215. The center spoke conductor 224b-1 is RF hot by reason of its connection to the axial center conductor 222-1. The outer spoke conductor 224b-2 extends from the grounded axial outer conductor 222-2 and is terminated at (and electrically connected to) the inner cylinder 200, while the center spoke conductor 224b-1 passes through the hole 226b (without contacting the inner conductive cylinder 200) to contact the center conductive cylinder 215.

In like manner, the spoke conductor 224c consists of a center spoke conductor 224c-1 and an outer spoke conductor 224c-2 surrounding the center spoke conductor 224c-1. The center spoke conductor 224c-1 extends radially from the axial center conductive conductor 222-1 and terminates at the center cylinder 215. The center spoke conductor 224c-1 is RF hot by reason of its connection to the axial center conductor 222-1. The outer spoke conductor 224c-2 extends from the grounded axial outer conductor 222-2 and is terminated at (and electrically connected to) the inner cylinder 200, while the center spoke conductor 224c-1 passes through the hole 226c (without contacting the inner conductive cylinder 200) to contact the center conductive cylinder 215.

The plural center spoke conductors 224a-1, 224b-1 and 224c-1 extend in the radial direction from the axial center conductor 222-1 to electrically contact the center conductive cylinder 215. The area of this contact defines a circular plane. The axial location of this circular plane is selected to be such that the electrical or RF impedance at this location matches the characteristic impedance of 224a, 224b and 224c, respectively, at the frequency of the VHF generator 190. The characteristic impedance of the individual spoke conductors 224a, 224b and 224c is selected such that their total impedance at the junction (the axial conductor bottom end 222b) matches the output impedance of the VHF generator 190 at the frequency of the VHF generator 190.

Preferably, the axial center conductor 222-1 has a radius r1 that is sufficient to enable the axial center conductor to carry a very high VHF current, typical of current at thousands of Watts of VHF power. For example, as depicted in FIG. 2C, the center conductor radius r1 may be on the order of a quarter inch (or more). The axial outer conductor 222-2 has an annular cross section with an inner radius r2. The characteristic (transmission line) impedance of the axial conductor 222 is determined by the ratio between r1 and r2 (in accordance with a well-known formula). This ratio is selected so that the transmission line characteristic impedance of the axial conductor 222 matches the output impedance of the VHF generator 190.

FIG. 3 is a cross-sectional view of the coaxial transmission line structure of the spoke conductor 224a, and is typical of the other spoke conductors 224b, 224c. The center spoke conductor 224a-1 has a circular cross-section of radius R1, while the outer spoke conductor 224a-2 has an annular cross-section of inner radius R2. Preferably, the center spoke conductor radius R1 is sufficiently large to enable the spoke conductor 224a to carry a very high VHF current, typical of current at thousands of Watts of VHF power. For example the radius R1 may be on the order of a quarter inch (or more). The characteristic impedance of the coaxial spoke conductor 224a is determined by the ratio between R1 and R2. This ratio is selected so that the characteristic impedance of each spoke conductor 224 is n times the impedance of the VHF generator, where n is an integer and is the number of spoke conductors 224. This feature ensures that the overall impedance presented by combination of the n parallel spoke conductors 224 is the same as the VHF generator impedance. (In the illustrated embodiments, n=3.) The structure of all of the other spoke conductors 224b, 224c is similar to that of the spoke conductor 224a depicted in FIG. 3.

Figure 4:
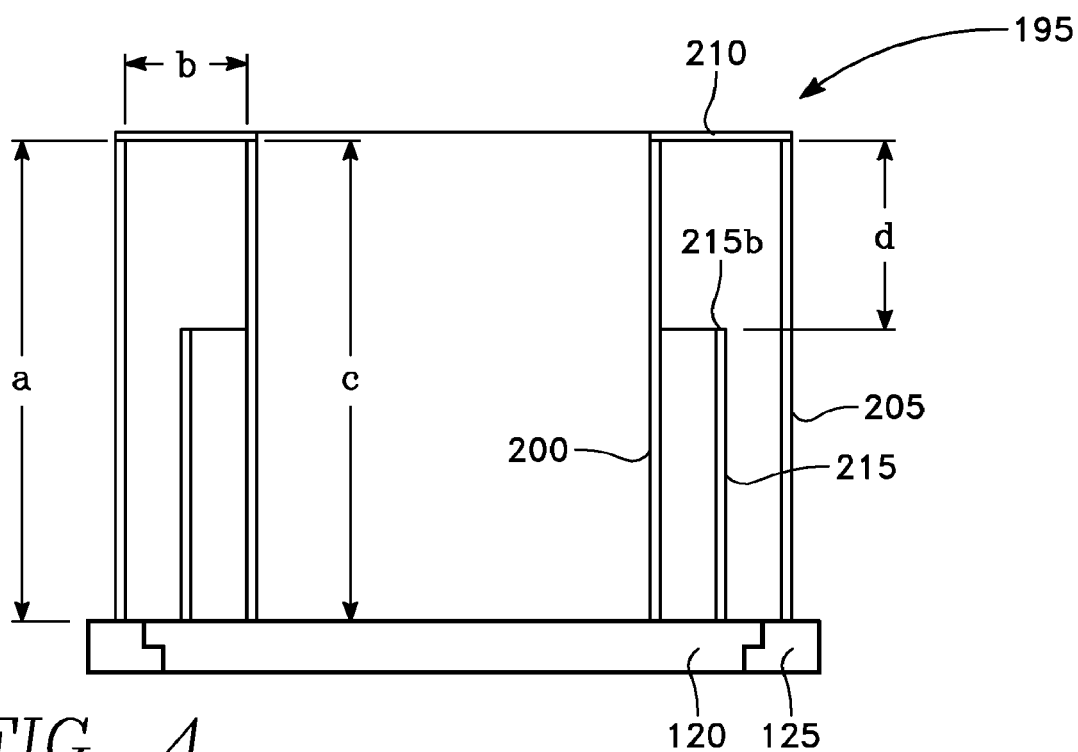
FIG. 4 depicts how the geometry of the resonator is defined for optimum resonance.

In order for the folded coaxial resonator 195 to attain at least near-resonance at the frequency of the VHF generator 190, the electrical path length along the interior surface formed by the inner and outer hollow conductive cylinders 200, 205 and the conductive annulus 210 is an integral fraction of the wavelength of the VHF generator. Preferably, this fraction is one-half. Thus, as depicted in FIG. 4, the sum of the axial lengths a and c along the interior surfaces of the inner and outer hollow conductive cylinders 200, 205, respectively, and the radial length b along the interior surface of the conductive annulus 210 is equal to the desired fraction (preferably, one half) of the VHF generator wavelength. However, exact resonance is not always attained by this arrangement of the lengths a, b, and c, the discrepancy arising from stray capacitances attributable to the folded geometry of the resonator. Such stray capacitances are compensated in order to attain nearly exact resonance in the folded coaxial resonator 195 by adjusting the gap distance d between the circular top edge 215b of the center hollow conductive cylinder 215 and the conductive annulus 210. This adjustment is readily performed by the skilled worker by trial and error to optimize resonance by the folded coaxial resonator 195 at the VHF generator frequency. For example, a network analyzer may be employed in conventional fashion to monitor resonance while the distance d is changed by modifying the center hollow conductive cylinder 215.

Figure 5:
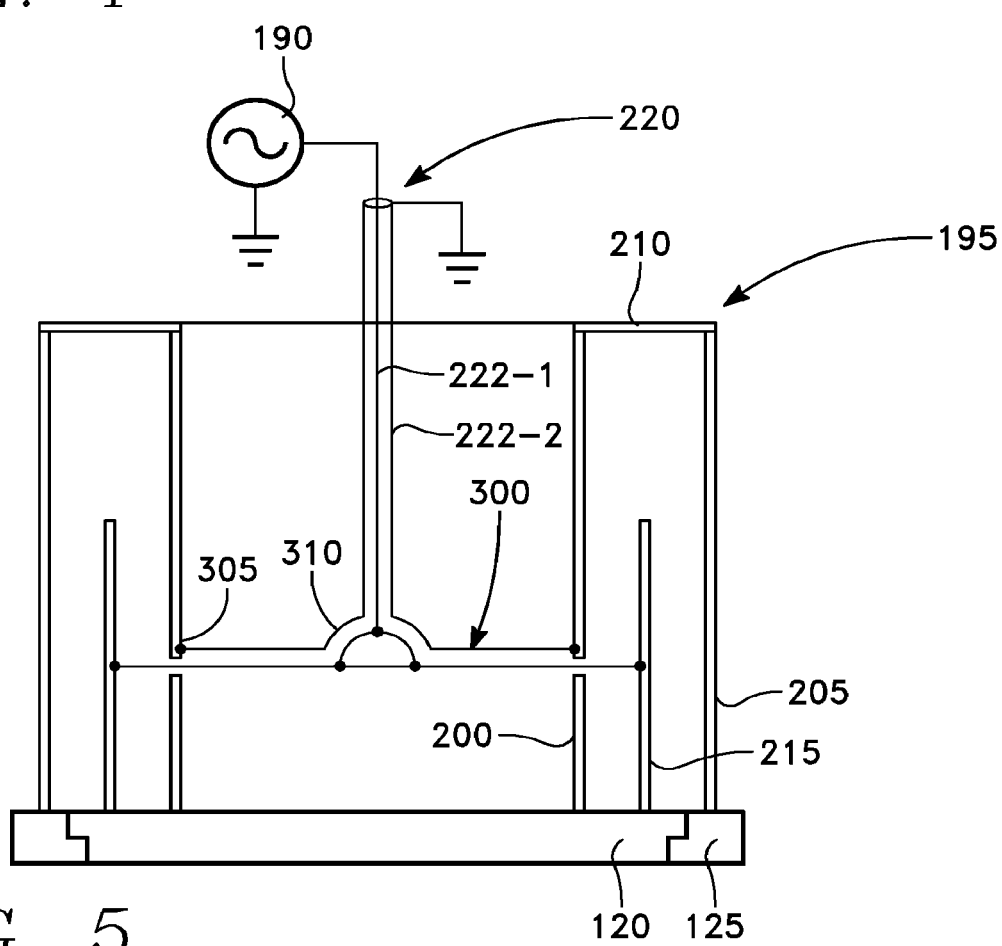
FIG. 5 depicts a plasma reactor in accordance with an alternative embodiment.

FIG. 5 depicts an embodiment of the VHF power coupler 220 in which the axial outer conductor 222-2 terminates at an annular ground plane conductor 300 having a circular outer edge 305 connected to the inner conductive cylinder 200. The annular ground plane conductor 300 may include a bell-shaped center section 310. In the embodiment of FIG. 5, the annular ground plane conductor 300 may replace the grounded outer coaxial conductors 224a-2, 224b-2, 224c-2 of the spoke conductors 224a, 224b, 224c.

Figure 6:
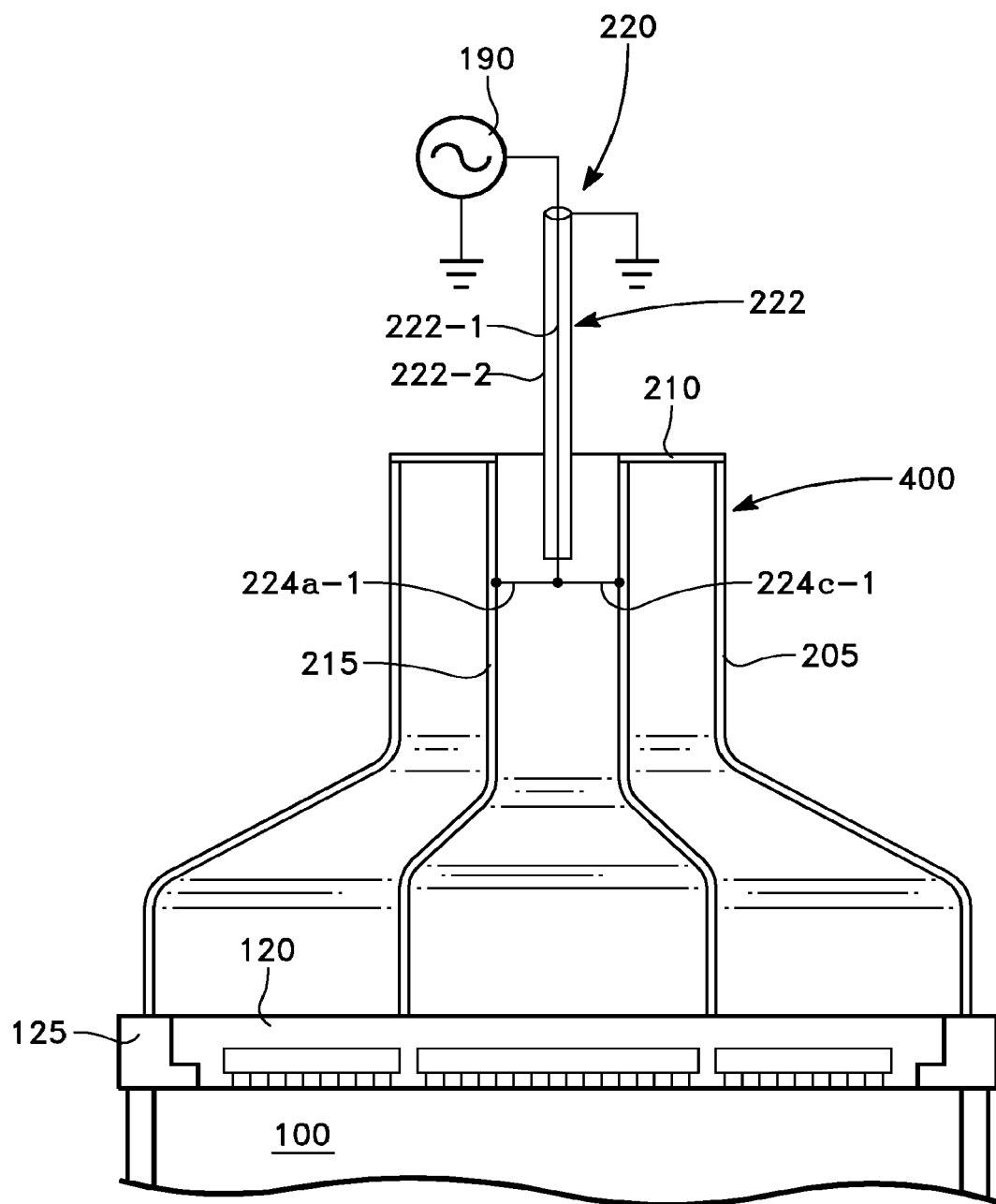
FIGS. 6 and 7 depict a plasma reactor in accordance with a further alternative embodiment.
Figure 7:
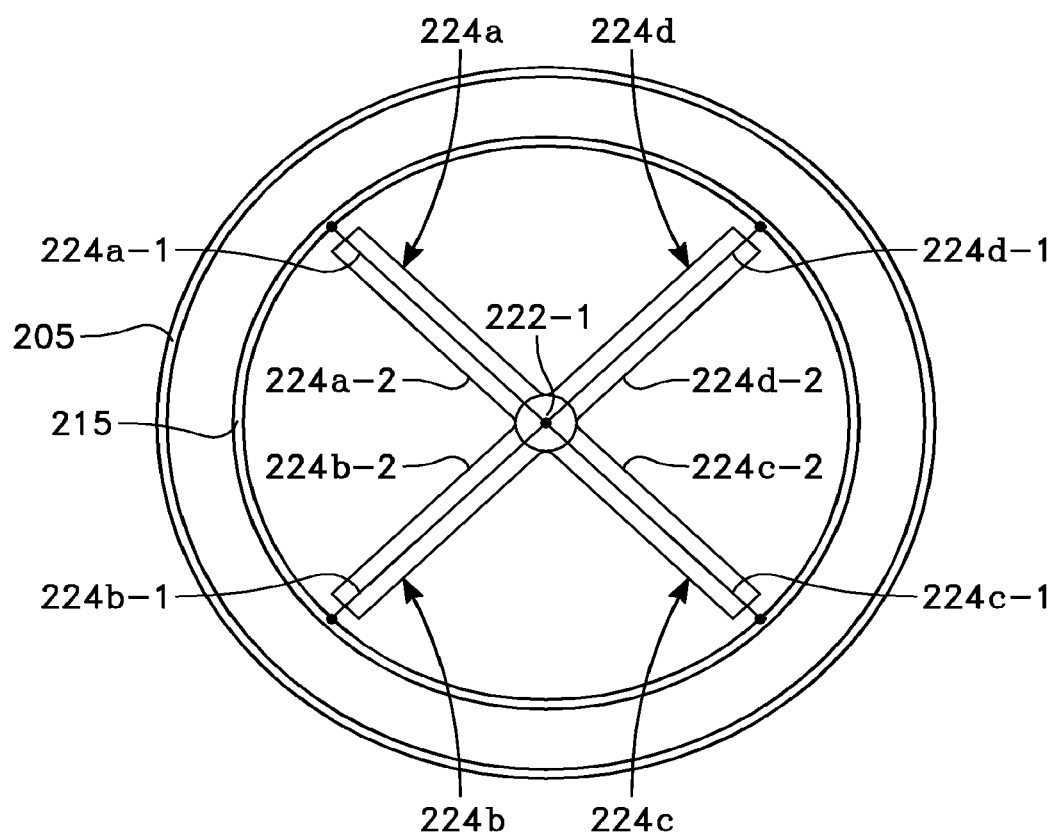

The VHF power coupler 220 with multiple spoke conductors 224 may be employed in cases where the resonator is not folded. FIGS. 6 and 7 depict such a case, in which a simple (unfolded) coaxial resonator (or coaxial tuning stub) 400 is a fixed impedance match element connected between the VHF generator 190 and the ceiling electrode 120. The coaxial resonator 400 consists of a center hollow conductive cylinder 215, a outer hollow conductive cylinder 205, and a conductive annulus 210 providing a D.C. short between the center and outer hollow conductive cylinders 215, 205. The VHF power coupler 220 in the embodiment of FIG. 6 includes an axial conductor 222 extending into and coaxial with the interior of the center conductive cylinder 215. The axial conductor 222 has a center conductor 222-1 and an outer conductor 222-2 coaxial with the center conductor 222-1. The axial center conductor 222-1 is connected at an exterior end to the VHF power generator 190. An opposite end of the axial center conductor 222-1, which may be referred to as the interior end, lies within the center hollow conductive cylinder 215 at a selected axial location. The axial outer conductor 222-2 is terminated near the selected axial location of the interior end of the axial center conductor.

Each of the spoke conductors 224a, 224b, 224c, 224d may have a coaxial structure including center spoke conductors 224a-1, 224b-1, 224c-1, 224d-1, respectively, surrounded by outer spoke conductors 224a-2, 224b-2, 224c-2, 224d-2, respectively. The interior end of the axial center conductor 222-1 provides a common terminal to which the plural center spoke conductors 224a-1, 224b-1, 2242c-1, 224d-1 are connected. The plural center spoke conductors 224a-1, 224b-1, 224c-1, 224d-1 extend in the radial direction from the axial center conductor 222-1 to electrically contact the center conductive cylinder 215. The area of this contact defines a circular plane. The axial location of this plane is selected to be such that the electrical or RF impedance at this location matches the impedance of the VHF generator 190.

As in embodiments previously described here, the ratio between the radii of the inner and outer conductors of the axial conductor 222 is selected to be such that the axial conductor 222 has a characteristic impedance matching that of the VHF generator. The ratios between the inner and outer conductors of each of the spoke conductors 224 is selected to be such that the characteristic impedance of each spoke conductor 224 is n times the VHF generator output impedance, where n is the number of spoke conductors 224. In the embodiment of FIGS. 6 and 7, n=4.

The outer spoke conductors 224a-2, 2224b-2, 224c-2, 224d-2 extend from the axial outer conductor 222-2 and form a grounded conductive enclosure. The outer spoke conductors 224a-2, 2224b-2, 224c-2, 224d-2 are terminated slightly away from the interior surface of the center hollow conductive cylinder 215 so as to not electrically contact the center conductive hollow cylinder 215.

The plural spoke conductors 224a through 224d provide an azimuthally symmetrical distribution of VHF power to the center hollow conductive cylinder 215. The result is a more symmetrical distribution of VHF plasma source power on the ceiling electrode 120 and therefore a more uniform distribution of plasma ion density over the workpiece support pedestal 130.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
   a vacuum chamber enclosure with a center electrode and a dielectric ring surrounding the center electrode;
   a coaxial resonator comprising
      a conductively connected assembly that includes
      (a) a hollow inner conductive cylinder having a bottom edge contacting said center electrode,
      (b) a hollow outer conductive cylinder surrounding said hollow inner conductive cylinder and having a bottom edge contacting said dielectric ring, and
      (c) an annular conductor extending between and electrically contacting said hollow inner conductive cylinder and said hollow outer conductive cylinder, and
      a hollow center conductive cylinder located between said hollow inner conductive cylinder and said hollow outer conductive cylinder, and having a bottom edge contacting said center electrode, said hollow center conductive cylinder having a top edge facing and spaced from said annular conductor by an axial gap length;
   a power coupler including a first axial conductor electrically coupled to the hollow center conductive cylinder and a cylindrical second axial conductor surrounding the first axial conductor and electrically coupled to the hollow inner conductive cylinder; and
   a VHF power generator to supply power to the coaxial resonator.

2. The reactor of claim 1, wherein the VHF power generator is electrically coupled to the first axial conductor.

3. The reactor of claim 2, wherein the cylindrical second axial conductor is coupled to ground.

4. The reactor of claim 1, wherein said hollow inner conductive cylinder is coaxial with said hollow center conductive cylinder.

5. The reactor of claim 1, said hollow center conductive cylinder is coaxial with said hollow inner conductive cylinder, and said hollow outer conductive cylinder is coaxial with said hollow center conductive cylinder.

6. The reactor of claim 1, wherein said annular conductor connects respective circular top edges of said hollow inner conductive cylinder and said hollow outer conductive cylinder.

7. The reactor of claim 1, wherein a sum of axial lengths of said hollow inner conductive cylinder and said hollow outer conductive cylinder and a radial length of said annular conductor is at least approximately equal to an integral fraction of a wavelength of a frequency of said VHF power generator.

8. The reactor of claim 7, wherein said integral fraction is one-half.

9. The reactor of claim 7, wherein said axial gap length is selected to optimize resonance of said coaxial resonator at the frequency of said VHF power generator.

10. The reactor of claim 1, wherein said hollow center conductive cylinder has a radius that is a geometric mean of a radii of said hollow inner conductive cylinder and said hollow outer conductive cylinder.

11. The reactor of claim 1, wherein said cylindrical second axial conductor connects to said conductively connected assembly and surrounds an aperture through said conductively connected assembly.

12. The reactor of claim 11, wherein said first axial conductor electrically extends through said aperture in said conductively connected assembly.

13. The reactor of claim 12, wherein said aperture is formed through said hollow inner conductive cylinder.

14. The reactor of claim 1, wherein said power coupler comprises plural radially-extending spoke conductors and plural radially-extending cylindrical conductors with each cylindrical conductor surrounding a respective spoke conductor.

15. The reactor of claim 1, wherein said center electrode comprises a gas distribution plate comprising plural interior gas passages and plural exterior gas ejection orifices on a bottom surface thereof, said plasma reactor further comprising:
   a process gas source;
   hollow gas lines coupled between said process gas source and said gas distribution plate, said hollow gas lines extending through an interior of said hollow inner conductive cylinder.

* * * * *